United States Patent
Woody et al.

(10) Patent No.: US 9,663,612 B2
(45) Date of Patent: *May 30, 2017

(54) PROCESS OF MANUFACTURING AND APPLICATIONS OF A MULTI-COMPONENT BENZO[1,2-B:4,5-B] DITHIPHENE-THIENOTHIOPHENE RANDOMLY SUBSTITUTED CONJUGATED POLYMERS FOR ORGANIC SOLAR CELLS

(71) Applicants: PHILLIPS 66 COMPANY, Houston, TX (US); SOLARMER ENERGY, INC., El Monte, CA (US)

(72) Inventors: Kathy Woody, Bartlesville, OK (US); Hui Huang, Beijing (CN); Ting He, Bartlesville, OK (US); Wei Wang, Arcadia, CA (US); Chenjun Shi, La Puente, CA (US); Yue Wu, San Gabriel, CA (US)

(73) Assignee: Phillips 66 Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/722,699

(22) Filed: May 27, 2015

(65) Prior Publication Data

US 2015/0344616 A1   Dec. 3, 2015

Related U.S. Application Data

(60) Provisional application No. 62/005,161, filed on May 30, 2014.

(51) Int. Cl.
*C08G 75/00* (2006.01)
*C08G 61/12* (2006.01)
(Continued)

(52) U.S. Cl.
CPC ........ *C08G 61/126* (2013.01); *H01L 51/0036* (2013.01); *H01L 51/0043* (2013.01);
(Continued)

(58) Field of Classification Search
CPC ............ H01L 51/0036; H01L 51/0047; C08G 2261/3243; C08G 2261/414; C08G 2261/124; C08G 2261/91
See application file for complete search history.

(56) References Cited

U.S. PATENT DOCUMENTS 8,436,134 B2   5/2013   Yu et al.
8,653,228 B2   2/2014   Yu et al.
(Continued)

*Primary Examiner* — Shane Fang
(74) *Attorney, Agent, or Firm* — Phillips 66 Company

(57) ABSTRACT

A process of polymerizing

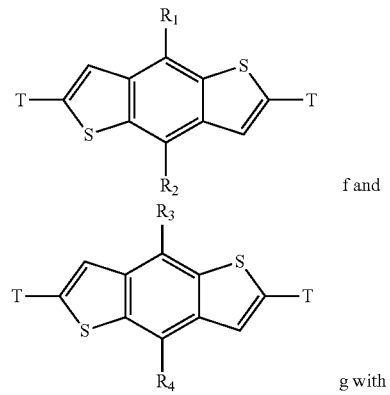

f and g with (Continued)

Current-voltage diagram of the 9.46% PCE P(BDT-FTT(P50)) solar cell.

-continued

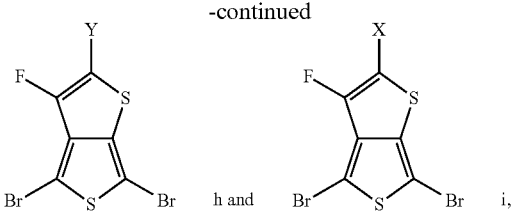

wherein the stoichiometric ratio of (f+g)≈(h+i) and f, g, h and i are not equal to 0. Additionally, R1, R2, R3 and R4 can be independently selected from the group consisting of alkyl group, alkoxy group, aryl groups and combinations thereof and where the combination of R1, R2, R3 and R4 are not all identical. In addition, x and y can be different from each other and independently selected from the group consisting of: alkyl group, alkoxy group, aryl groups,

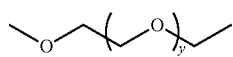

where y=1-3,

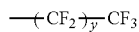

where y=0-12,

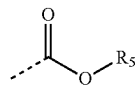

where R5 is selected from the group consisting of H, alkyl group, alkoxy group, aryl groups,

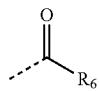

where R6 is selected from the group consisting of H, alkyl group, alkoxy group, aryl groups,

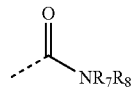

where R7 and R8 are independently selected from the group consisting of H, alkyl group, alkoxy group, aryl groups, —$NR_9R_{10}$ where R9 and R10 are independently selected from the group consisting of H, alkyl group, alkoxy group, aryl groups.

15 Claims, 1 Drawing Sheet

(51) Int. Cl.
  *H01L 51/00* (2006.01)
  *H01L 51/42* (2006.01)
(52) U.S. Cl.
  CPC ... *C08G 2261/12* (2013.01); *C08G 2261/146* (2013.01); *C08G 2261/149* (2013.01); *C08G 2261/1426* (2013.01); *C08G 2261/1428* (2013.01); *C08G 2261/18* (2013.01); *C08G 2261/3223* (2013.01); *C08G 2261/3243* (2013.01); *C08G 2261/414* (2013.01); *C08G 2261/91* (2013.01); *H01L 51/4253* (2013.01); *Y02E 10/549* (2013.01)

(56) References Cited

U.S. PATENT DOCUMENTS

| | | |
|---|---|---|
| 8,703,960 B2 | 4/2014 | Huang |
| 8,895,751 B2 | 11/2014 | Huang |
| 2012/0279568 A1* | 11/2012 | Choi .................. H01L 51/0036 136/263 |
| 2013/0056071 A1 | 3/2013 | Palkar et al. |
| 2013/0214213 A1 | 8/2013 | Wang et al. |
| 2014/0151657 A1 | 6/2014 | Wang et al. |
| 2014/0221590 A1 | 8/2014 | Woody et al. |
| 2015/0136224 A1 | 5/2015 | Shi et al. |
| 2015/0210800 A1 | 7/2015 | Wang et al. |

\* cited by examiner

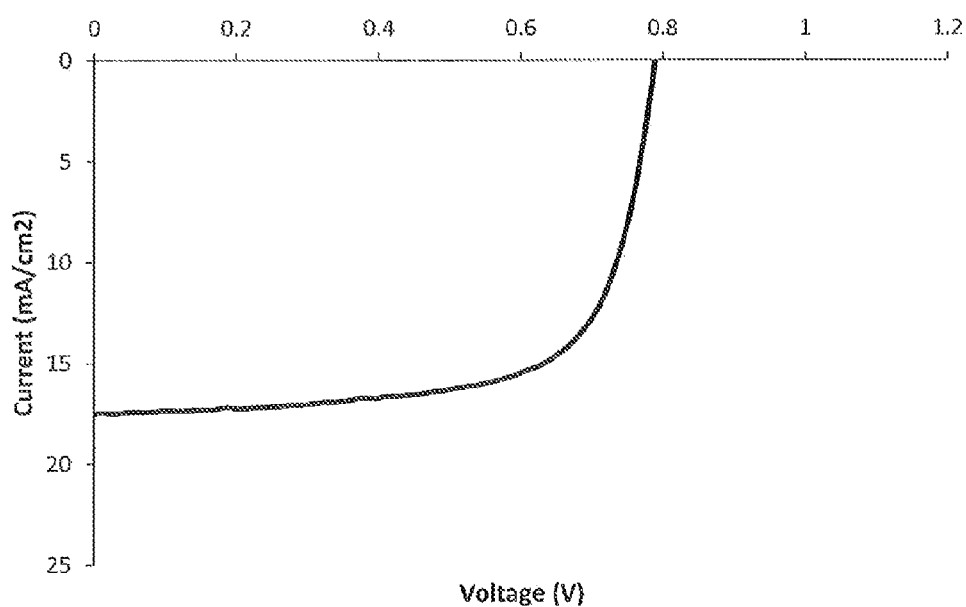
Current-voltage diagram of the 9.46% PCE P(BDT-FTT(P50)) solar cell.

PROCESS OF MANUFACTURING AND APPLICATIONS OF A MULTI-COMPONENT BENZO[1,2-B:4,5-B] DITHIPHENE-THIENOTHIOPHENE RANDOMLY SUBSTITUTED CONJUGATED POLYMERS FOR ORGANIC SOLAR CELLS

CROSS-REFERENCE TO RELATED APPLICATIONS

This application is a non-provisional application which claims the benefit of and priority to U.S. Provisional Application Ser. No. 62/005,161 filed May 30, 2014, entitled "Process of Manufacturing and Applications of a Multi-Component Benzo[1,2-B:4,5-B]Dithiophene-Thienothiophene Randomly Substituted Conjugated Polymers for Organic Solar Cells," which is hereby incorporated by reference in its entirety.

STATEMENT REGARDING FEDERALLY SPONSORED RESEARCH OR DEVELOPMENT

None.

FIELD OF THE INVENTION

This invention relates to process and applications for a multi-component benzo[1,2-b:4,5-b]dithiophene-thienothiophene conjugated polymer.

BACKGROUND OF THE INVENTION

Solar energy using photovoltaic effect requires active semiconducting materials to convert light into electricity. Currently, solar cells based on silicon are the dominating technology due to their high conversion efficiency. Recently, solar cells based on organic materials showed interesting features, especially on the potential of low cost in materials and processing. Judging from the recent success in organic light emitting diodes based on a reverse effect of photovoltaic effect, organic solar cells are very promising.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization. However, the diffusion length of an exciton is typically much less than the optical absorption length, requiring a trade off between using a thick, and therefore resistive, cell with multiple or highly folded interfaces, or a thin cell with a low optical absorption efficiency.

Conjugated polymers are polymers containing π-electron conjugated units along the main chain. They can be used as active layer materials for some types of photo-electric devices, such as polymer light emitting devices, polymer solar cells, polymer field effect transistors, etc. As polymer solar cell materials, conjugated polymers should possess some properties, such as high mobility, good harvest of sunlight, good processibility, and proper molecular energy level. Some conjugated polymers have proven to be good solar cell materials. Conjugated polymers are made of alternating single and double covalent bonds. The conjugated polymers have a δ-bond backbone of intersecting $sp^2$ hybrid orbitals. The $p_z$ orbitals on the carbon atoms overlap with neighboring $p_z$ orbitals to provide n-bonds. The electrons that comprise the π-bonds are delocalized over the whole molecule. These polymers exhibit electronic properties similar to those seen in inorganic semiconductors. The semiconducting properties of the photovoltaic polymers are derived from their delocalized π bonds. The substituents of the polymers also largely influence the electronic properties. The optical bandgap, mobility and thin-film morphology are affected by both the type of functional group used as a substituent and the bulkiness and length of the side chain. Polymers which have only minor differences in the side chains will have large differences in the device performance.

There is a need in the art for polymer solar cells that exhibit increased solar conversion efficiency.

BRIEF SUMMARY OF THE DISCLOSURE

A process of polymerizing

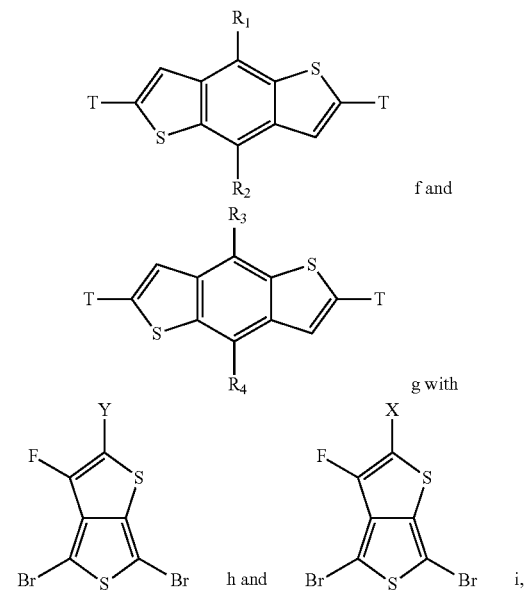

f and g with h and i, wherein the stoichiometric ratio of (f+g)≈(h+i) and f, g, h and i are not equal to 0. Additionally, R1, R2, R3 and R4 can be independently selected from the group consisting of alkyl group, alkoxy group, aryl groups and combinations thereof and where the combination of R1, R2, R3 and R4 are not all identical. In addition, x and y can be different from each other and independently selected from the group consisting of: alkyl group, alkoxy group, aryl groups,

where y=1-3,

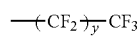

where y=0-12,

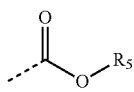

where R5 is selected from the group consisting of H, alkyl group, alkoxy group, aryl groups,

where R6 is selected from the group consisting of H, alkyl group, alkoxy group, aryl groups,

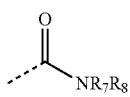

where R7 and R8 are independently selected from the group consisting of H, alkyl group, alkoxy group, aryl groups, —$NR_9R_{10}$ where R9 and R10 are independently selected from the group consisting of H, alkyl group, alkoxy group, aryl groups.

A different process of polymerizing

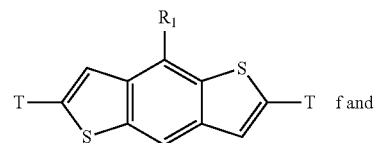 f and

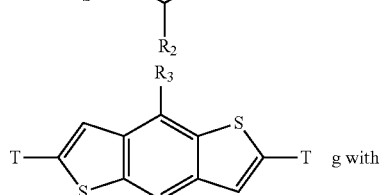 g with

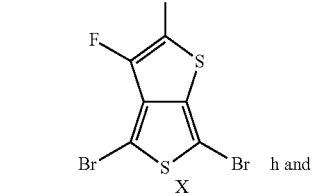 h and

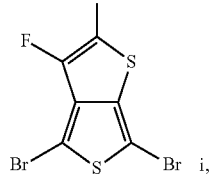 i, wherein the stoichiometric ratio of (f+g)≈(h+i) and f, g, h and i are not equal to 0. In this process, the substituent T of compound f and g reacts exclusively with substituents Z of compounds h and i. Additionally, R1, R2, R3 and R4 can be independently selected from the group consisting of alkyl group, alkoxy group, aryl groups and combinations thereof and where the combination of R1, R2, R3 and R4 are not all identical. In addition, x and y can be different from each other and independently selected from the group consisting of: alkyl group, alkoxy group, aryl groups,

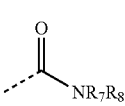

where y=1-3, $$-(CF_2)_y-CF_3$$

where y=0-12,

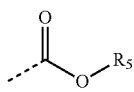

where R5 is selected from the group consisting of H, alkyl group, alkoxy group, aryl groups,

where R6 is selected from the group consisting of H, alkyl group, alkoxy group, aryl groups,

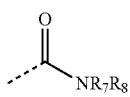

where R7 and R8 are independently selected from the group consisting of H, alkyl group, alkoxy group, aryl groups, —$NR_9$ $R_{10}$ where R9 and R10 are independently selected from the group consisting of H, alkyl group, alkoxy group, aryl groups. Additionally in this process the polymerization of f, g, h and i are selected from stille coupling, suzuki coupling, a nickel catalyzed reaction or direct arylation.

Another process is taught for polymerizing

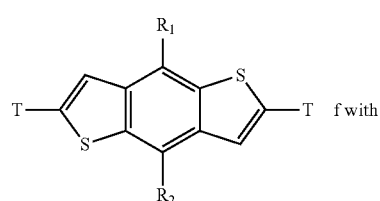 f with

-continued

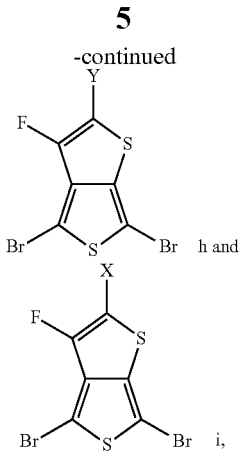 h and

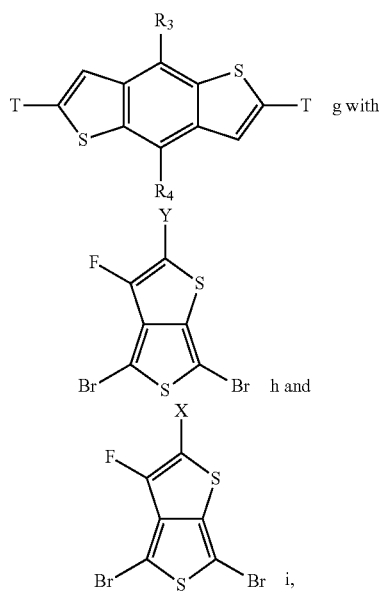 i, wherein the improvement comprises simultaneously polymerizing

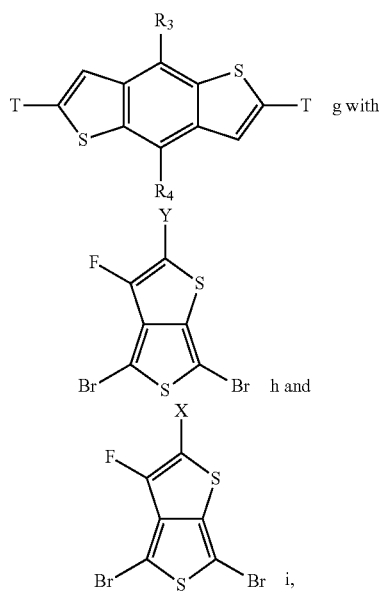 g with wherein the stoichiometric ratio of (f+g)≈(h+i) and f, g, h and i are not equal to 0. In this process, the substituent T of compound f and g reacts exclusively with substituents Z of compounds h and i. Additionally, R1, R2, R3 and R4 can be independently selected from the group consisting of alkyl group, alkoxy group, aryl groups and combinations thereof and where the combination of R1, R2, R3 and R4 are not all identical. In addition, x and y can be different from each other and independently selected from the group consisting of: alkyl group, alkoxy group, aryl groups,

where y=1-3,

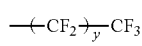

where y=0-12,

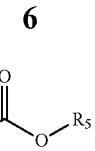

where R5 is selected from the group consisting of H, alkyl group, alkoxy group, aryl groups,

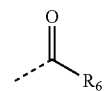

where R6 is selected from the group consisting of H, alkyl group, alkoxy group, aryl groups,

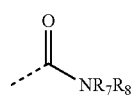

where R7 and R8 are independently selected from the group consisting of H, alkyl group, alkoxy group, aryl groups, —NR9R10 where R9 and R10 are independently selected from the group consisting of H, alkyl group, alkoxy group, aryl groups.

BRIEF DESCRIPTION OF THE DRAWINGS

A more complete understanding of the present invention and benefits thereof may be acquired by referring to the follow description taken in conjunction with the accompanying drawings in which:

The figure depicts a current-voltage diagram of a solar cell

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, more preferably, 1 to 20 carbon atoms, and even more preferably, 1 to 10 carbon atoms and includes straight and branched chains such as methyl, ethyl, n-propyl, iso-propyl, n-butyl, isobutyl, sec-butyl, t-butyl, n-pentyl, iso-pentyl, neo-pentyl, n-hexyl, and isohexyl. In this application alkyl groups can include the possibility of substituted and unsubstituted alkyl groups.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 10 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

The present embodiment describes a process of polymerizing

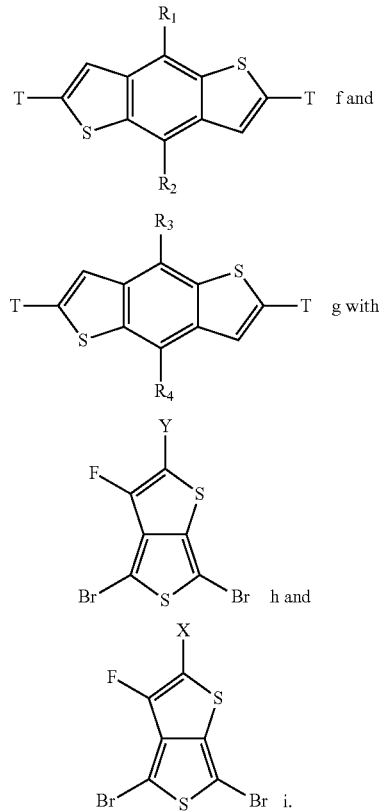

f and g with h and i.

In this embodiment, the stoichiometric ratio of (f+g)≈(h+i) and f, g, h and i are not equal to 0. Additionally, in this embodiment, R1, R2, R3 and R4 can be independently selected from the group consisting of alkyl group, alkoxy group, aryl groups and combinations thereof and where the combination of R1, R2, R3 and R4 are not all identical. Additionally, in this embodiment, x and y can be different from each other and independently selected from the group consisting of: alkyl group, alkoxy group, aryl groups,

where y=1-3,

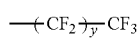

where y=0-12,

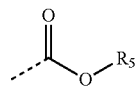

where R5 is selected from the group consisting of H, alkyl group, alkoxy group, aryl groups,

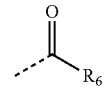

where R6 is selected from the group consisting of H, alkyl group, alkoxy group, aryl groups,

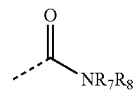

where R7 and R8 are independently selected from the group consisting of H, alkyl group, alkoxy group, aryl groups, —NR9R10 where R9 and R10 are independently selected from the group consisting of H, alkyl group, alkoxy group, aryl groups.

In one embodiment, the aromatic substituents comprise of heterocycles and fused heterocycles. In other embodiment the process produces a conjugated polymer. In another embodiment the polymerizing of f, g, h and i is regio-regular. In yet another embodiment the polymerizing of f, g, h and i is regio-random.

The polymers produced from the present disclosure can be used as an active layer material or photovoltaic materials in electronic devices or photovoltaic devices such as photodetector devices, solar cell devices, and the like. Photovoltaic devices, including solar cell devices, are generally comprised of laminates of a suitable photovoltaic material between a hole-collecting electrode layer and an electron. In one embodiment the electronic devices are field effect transistors, light emitting devices, and sensors, electrochromic devices and capacitors.

In yet another embodiment, the ratio of

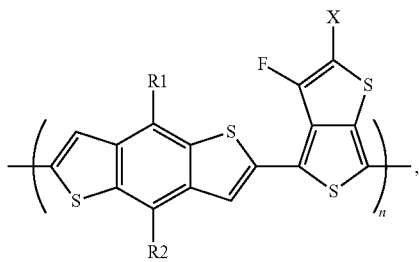

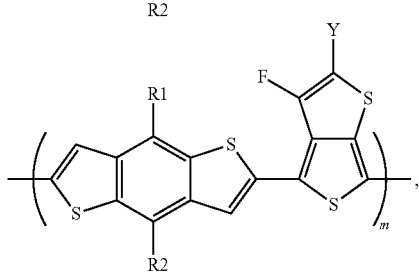

-continued

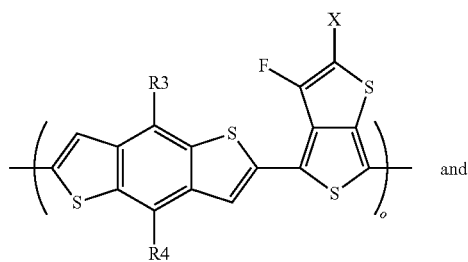

and

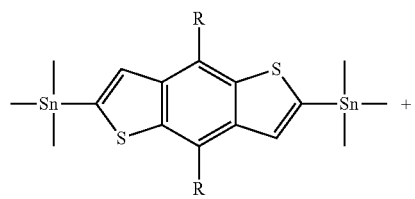

in the polymer is around 25:25:25:25.

Different types of polymerization reactions can occur to polymerize f and g with h and i. The current embodiments of these processes are not limited to one specific type of polymerization reaction but can include any currently known polymerization reaction capable of reaction f and g with h and i. Some of these polymerization reactions include:

Stille coupling:

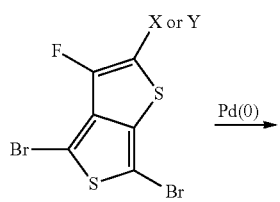

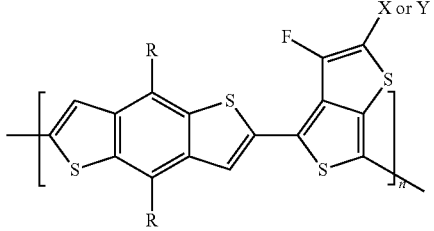

Suzuki coupling:

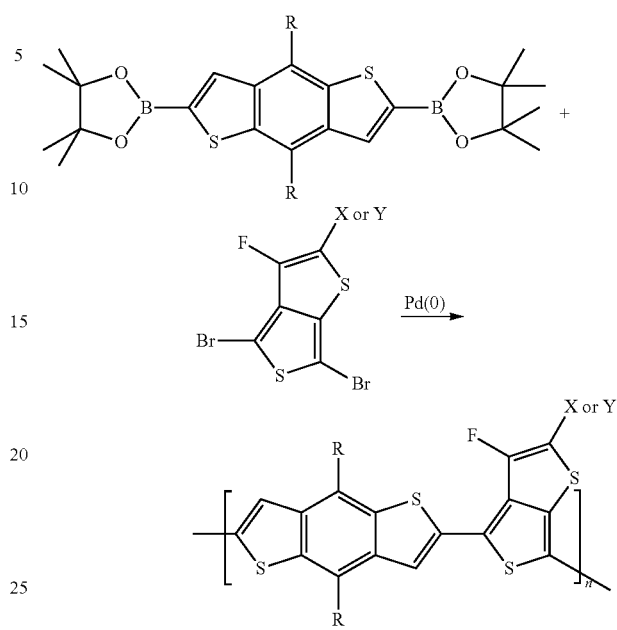

Nickel catalyzed

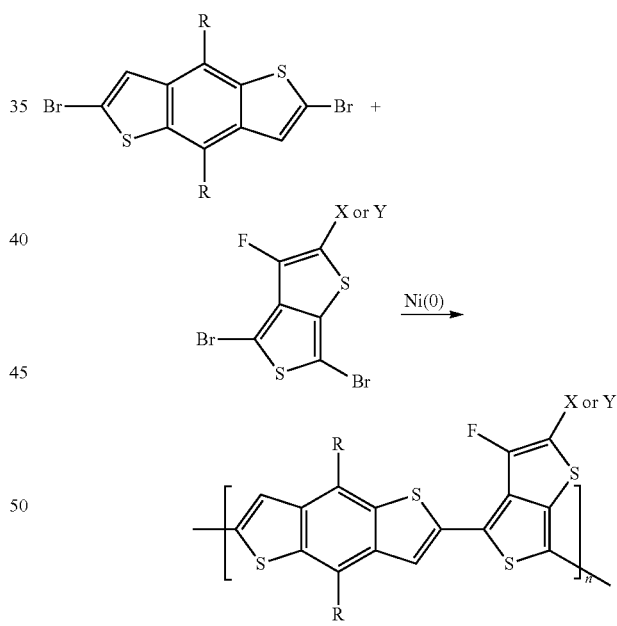

Direct arylation

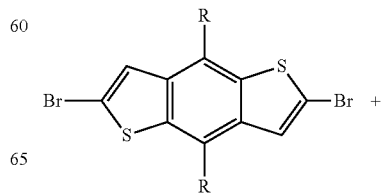

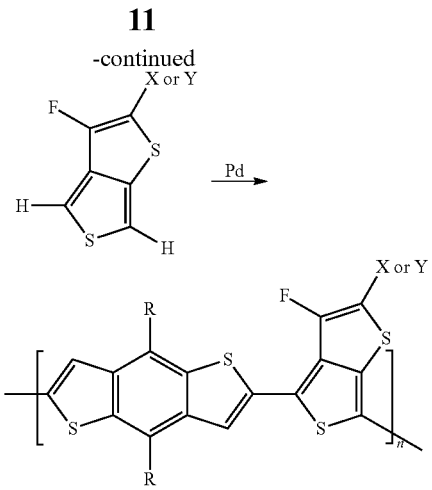

In one embodiment, the substituent T can be selected from Me₃Sn, C₆H₁₂,O₂B, Br or any other substituent that can be used in the polymerization reaction. In another embodiment the substituent T of compound f and g reacts exclusively with substituents Z of compounds h and i.

In one embodiment,

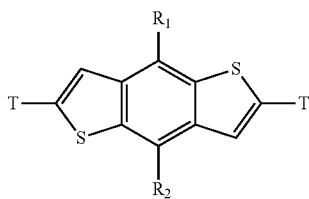

is a di-Me3Sn substituted benzo[1,2-b:4,5-b']dithiophene. In another embodiment,

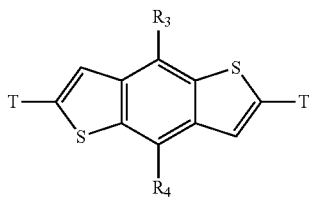

is a di-Me3Sn substituted benzo[1,2-b:4,5-b']dithiophene.

Typically, the number average molecular weight of the polymers is in the range of approximately 1000 to 1,000,000, with ideal polymers having a number average molecular weight in the range of about 5000 to 500,000, and some ideal polymers having a number average molecular weight in the range of approximately 20,000 to 200,000. It will be appreciated that molecular weight can be varied to optimize polymer properties and the inventions of the present disclosure cover all molecular weights. For example, lower molecular weight can ensure solubility, while a higher molecular weight can ensure good film-forming properties.

The polymers produced from the present disclosure can be used as photovoltaic materials in photovoltaic devices such as photodetector devices, solar cell devices, and the like. Photovoltaic devices, including solar cell devices, are generally comprised of laminates of a suitable photovoltaic material between a hole-collecting electrode layer and an electron-collecting layer. Additional layers, elements or a substrate may or may not be present.

EXAMPLES

List of acronyms used:
BDT: Benzo[1,2-b:4,5-b']dithiophene
FTT: 3-Fluorothieno[3,4-b]thiophene
FTT(E): 2-ethylhexyl 3-fluorothieno[3,4-b]thiophene-2-carboxylate
FTT(P): propyl 3-fluorothieno[3,4-b]thiophene-2-carboxylate
FTT(N): 3-fluoro-N,N-dihexylthieno[3,4-b]thiophene-2-carboxamide
FTT (K1): 2-ethyl-1-(3-fluorothieno[3,4-b]thiophen-2-yl)hexan-1-one
FTT (K2): 1-(3-fluorothieno[3,4-b]thiophen-2-yl)butan-1-one
PCE: power conversion efficiency
Jsc: short circuit current
Voc: open circuit voltage
PDI: polydispersity index
$M_n$: number average molecular weight defined by $(\Sigma NiMi)/\Sigma Ni$ where Mi is the molecular weight of a chain and Ni is the number of chains of that molecular weight
Soxhlet Extraction: The polymer is washed using a reflux apparatus with different solvents. The solvent and polymer is then heated till the solvent evaporates into a gas, then cools into a liquid. The solvent is then evaporated off and polymer products are produced.

Example 1

P(BDT-FTT(P)), (100% FTT-propyl): Monomers BDT (0.228 g, 0.252 mmol) and FTT(P) (0.101 g, 0.251 mmol) were combined in a Schlenk flask with Pd(PPh₃)₄ (14 mg), toluene (10 mL) and dimethylformamide (4 mL). The solution was heated to 130° C. and stirred for 36 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=40 kDa and PDI=2.08).

Example 2

P(BDT-FTT(P70)), (70% FTT-propyl, 30% FTT-ethylhexyl): Monomers BDT (0.142 g, 0.157 mmol), FTT(E) (0.022 g, 0.047 mmol) and FTT(P) (0.044 g, 0.109 mmol) were combined in a Schlenk flask with Pd(PPh₃)₄ (12 mg), toluene (7 mL) and DMF (2.5 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=17 kDa and PDI=3.70).

Example 3

P(BDT-FTT(P50)), (50% FTT-propyl, 50% FTT-ethylhexyl): Monomers BDT (0.108 g, 0.119 mmol), FTT(E) (0.028 g, 0.059 mmol) and FTT(P) (0.024 g, 0.059 mmol) were combined in a Schlenk flask with Pd(PPh$_3$)$_4$ (7 mg), toluene (6 mL) and DMF (2 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=34 kDa and PDI=3.17).

Example 4

P(BDT-FTT(P30)), (30% FTT-propyl, 70% FTT-ethylhexyl): Monomers BDT (0.080 g, 0.088 mmol), FTT(E) (0.029 g, 0.061 mmol) and FTT(P) (0.011 g, 0.027 mmol) were combined in a Schlenk flask with Pd(PPh$_3$)$_4$ (5 mg), toluene (6 mL) and DMF (3 mL). The solution was heated to 130° C. and stirred for 36 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=63 kDa and PDI=2.96).

Example 5

P(BDT-FTT(P10)), (10% FTT-propyl, 90% FTT-ethylhexyl): Monomers BDT (0.093 g, 0.103 mmol), FTT(E) (0.044 g, 0.093 mmol) and FTT(P) (0.004 g, 0.010 mmol) were combined in a Schlenk flask with Pd(PPh$_3$)$_4$ (6 mg), toluene (6 mL) and DMF (2 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=24 kDa and PDI=2.08).

Example 6

PBDT-FTT(E), (100% FTT-ethylhexyl): Monomers BDT (0.115 g) and FTT(E) (0.060 g) were combined in a Schlenk flask with Pd(PPh$_3$)$_4$ (7 mg) in toluene (4 mL) and DMF (1 mL). The solution was heated to 115° C. and stirred for 96 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=24 kDa and PDI=2.1).

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Example 7

P4BDT-FTT(E))$_{0.25}$-(BDT-FTT(K1))$_{0.75}$) Monomers distannyl-BDT (0.10 g, 0.11 mmol)), dibromo-FTT(E) (13 mg, 0.0275 mmol) and dibromo-FTT(K1) (36.5 mg, 0.0825 mmol) were combined in a Schlenk flask with Pd(PPh$_3$)$_4$ (12.8 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=41 kDa and PDI=2.9).

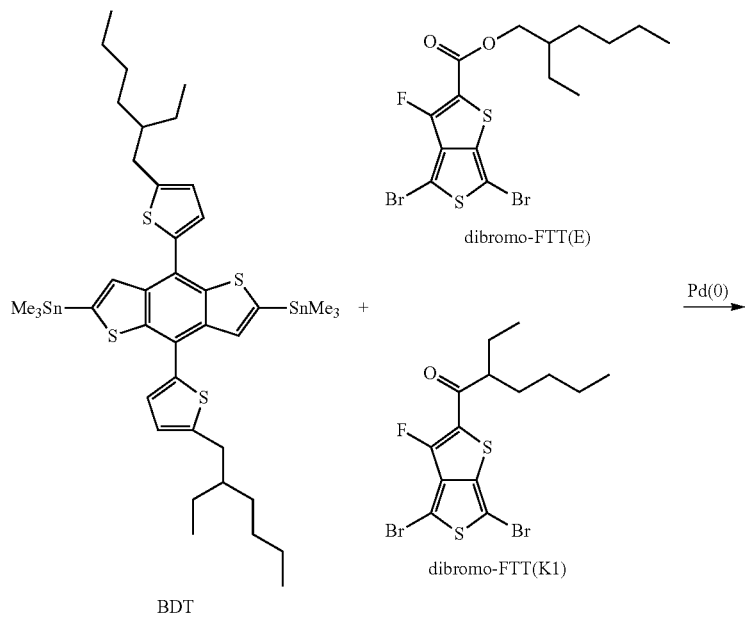

-continued

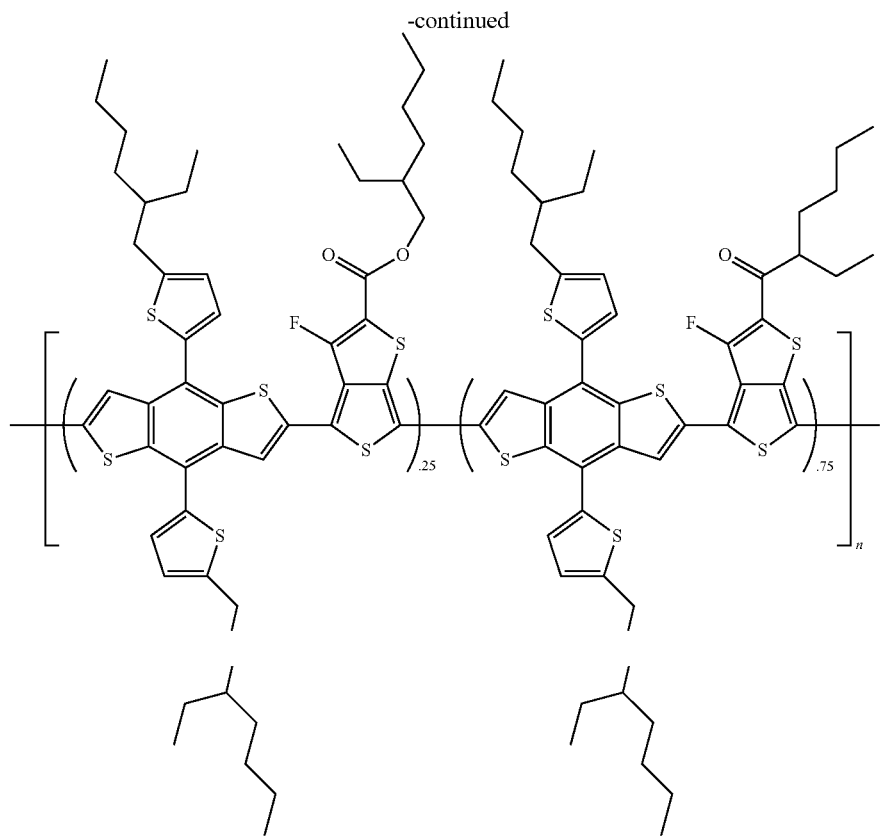

Example 8

P((BDT-FTT(E))$_{0.5}$-(BDT-FTT(K1))$_{0.5}$) Monomers distannyl-BDT (100 mg, 0.11 mmol)), dibromo-FTT(E) (26 mg, 0.055 mmol) and dibromo-FTT(K1) (24 mg, 0.055 mmol) were combined in a Schlenk flask with Pd(PPh$_3$)$_4$ (13 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=29.6 kDa and PDI=2.9).

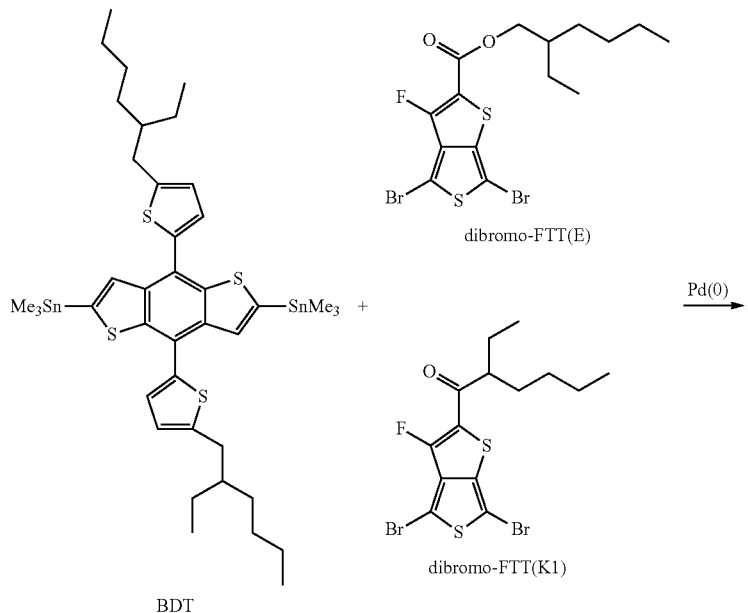

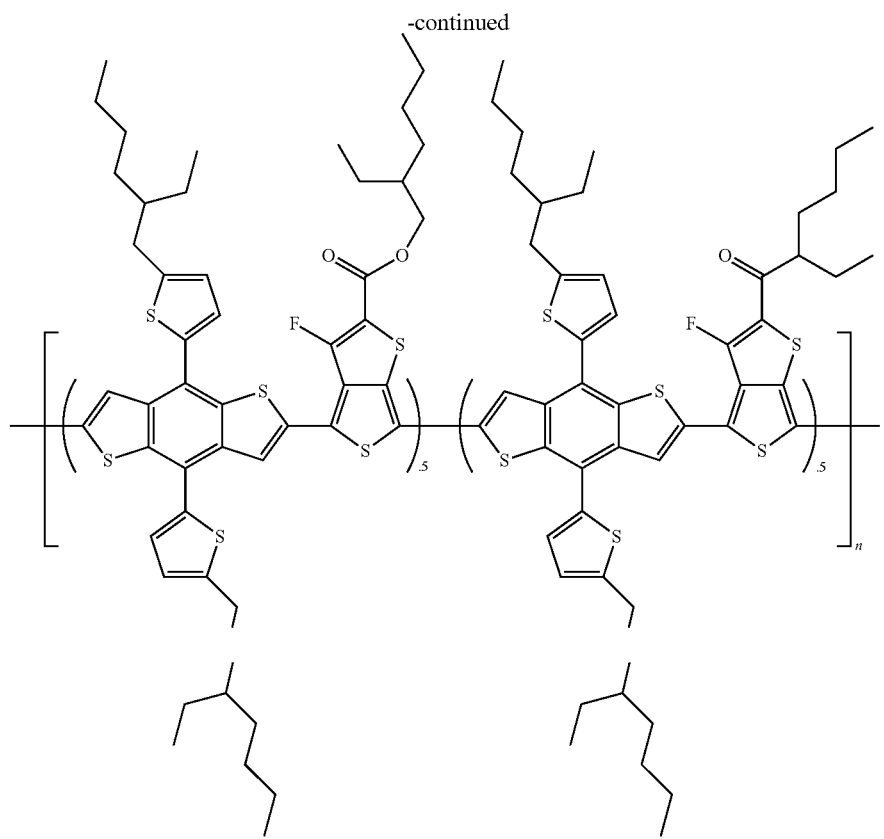

Example 9

P((BDT-FTT(E))$_{0.75}$-(BDT-FTT(K1))$_{0.25}$) Monomers distannyl-BDT (100 mg, 0.11 mmol)), dibromo-FTT(E) (39 mg, 0.0825 mmol) and dibromo-FTT(K1) were combined in a Schlenk flask with Pd(PPh$_3$)$_4$ (13 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=20 kDa and PDI=2.43).

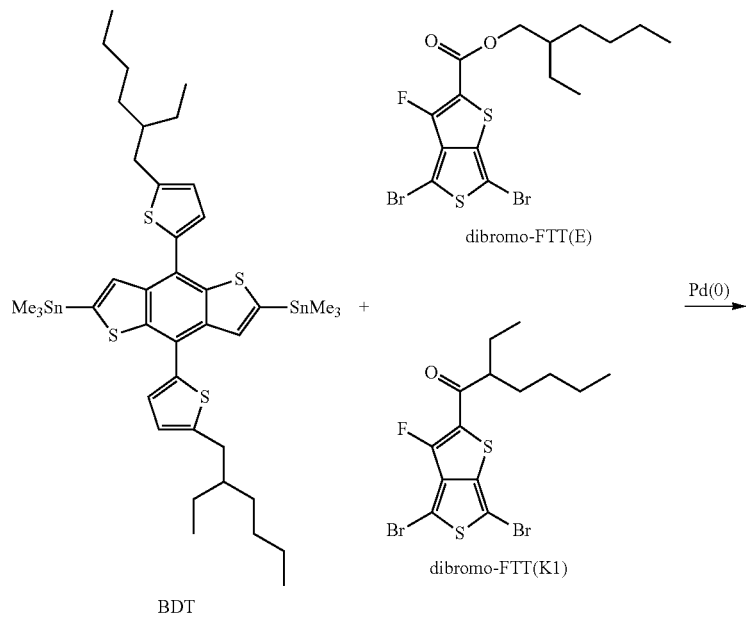

-continued

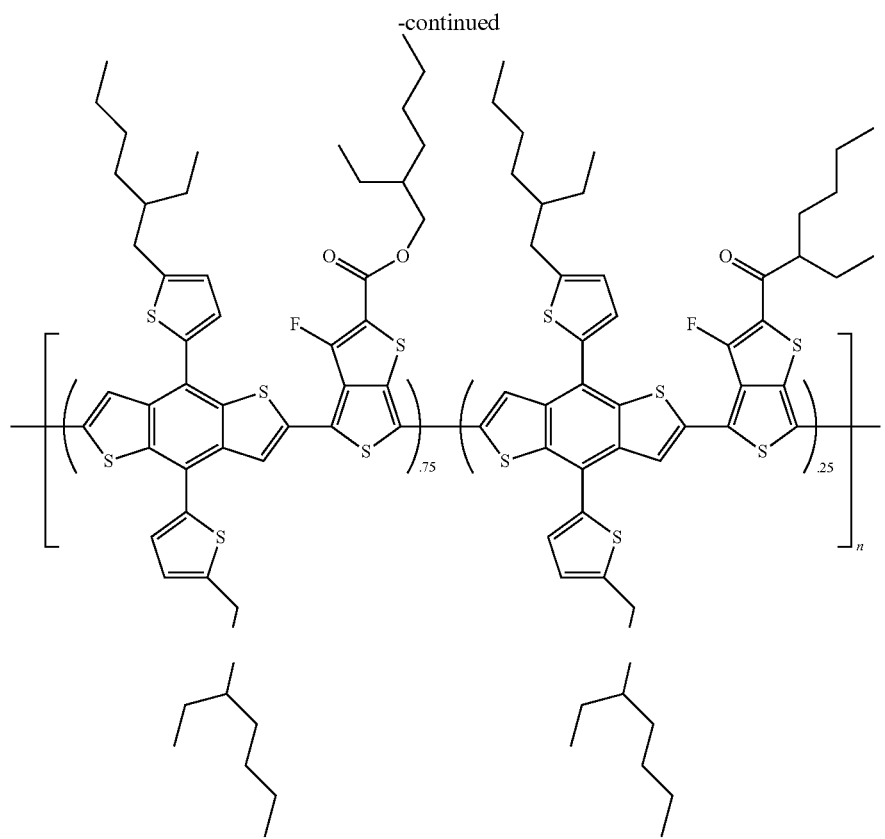

Example 10

P((BDT-FTT(E))$_{0.5}$-(BDT-FTT(K2))$_{0.5}$) Monomers distannyl-BDT (100 mg, 0.11 mmol)), dibromo-FTT(E) (26 mg, 0.055 mmol) and dibromo-FTT(K2) (21 mg, 0.055 mmol) were combined in a Schlenk flask with Pd(PPh$_3$)$_4$ (7 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=23 kDa and PDI=1.4).

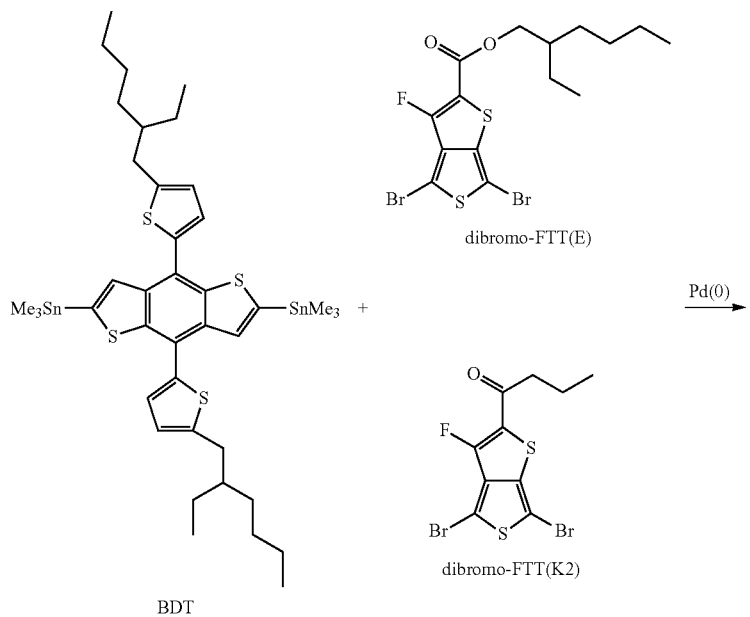

-continued

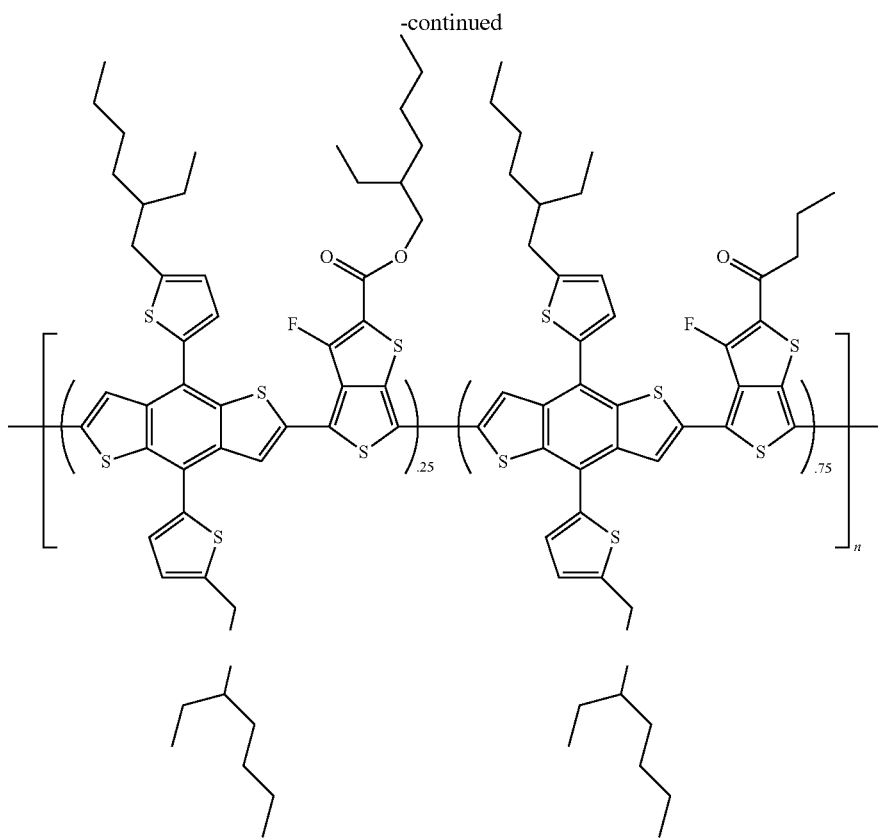

Example 11

P((BDT-FTT(P))$_{0.5}$-(BDT-FTT(K1))$_{0.5}$) Monomers distannyl-BDT (0.185 g, 0.21 mmol)), dibromo-FTT(P) (42 mg, 0.10 mmol) and dibromo-FTT(K1) (44 mg, 0.10 mmol) were combined in a Schlenk flask with Pd(PPh$_3$)$_4$ (32 mg) in toluene (9 mL) and DMF (3 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=16 kDa and PDI=1.9).

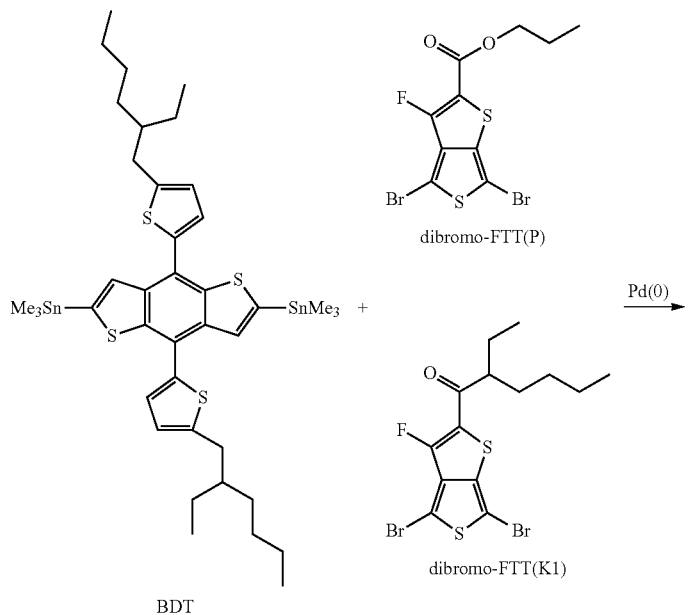

-continued

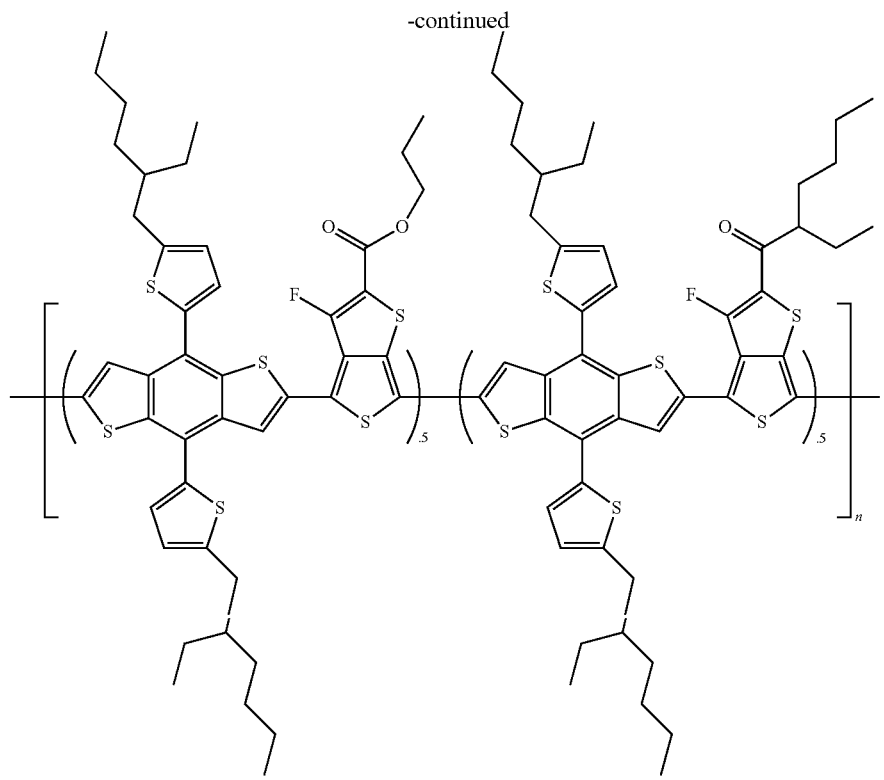

Example 12

P[(BDT1-FTTN)-(BDT2-FTTE)] Monomers distannyl-BDT1 (0.055 mmol), distannyl-BDT2 (0.111 mmol), dibromo-FTTE (39.15 mg, 0.083 mmol) and dibromo-FTTN (43.72 mg, 0.083 mmol) were combined in a Schlenk flask with Pd(PPh$_3$)$_4$ (19.1 mg, 0.017 mmol), toluene (6.6 mL) and DMF (1.65 mL). The reaction mixture was degassed via two freeze-pump-thaw cycles, using liquid nitrogen to freeze the solution. The solution was then heated to 120° C. and stirred for one day under Argon atmosphere. The reaction mixture was cooled to room temperature, poured into methanol (70 mL), and the polymer was collected by filtration. The polymer was purified by Soxhlet extraction, washing sequentially with acetone, hexanes, and chloroform. The polymer was recovered in the chloroform fraction (110 mg, 71% yield).

Example 13

P[(BDT1-FTTN)-(BDT2-FTTP)] Monomers distannyl-BDT1 (0.055 mmol), distannyl-BDT2 (0.111 mmol), dibromo-FTTP (33.34 mg, 0.083 mmol) and dibromo-FTTN (43.72 mg, 0.083 mmol) were combined in a Schlenk flask with Pd(PPh$_3$)$_4$ (19.1 mg, 0.017 mmol), toluene (6.6 mL) and DMF (1.65 mL). The reaction mixture was degassed via two freeze-pump-thaw cycles, using liquid nitrogen to freeze the solution. The solution was then heated to 120° C. and stirred for one day under Argon atmosphere. The reaction mixture was cooled to room temperature, poured into methanol (70 mL), and the polymer was collected by filtration. The polymer was purified by Soxhlet extraction, washing sequentially with acetone, hexanes, and chloroform. The polymer was recovered in the chloroform fraction (100 mg, 67% yield).

Example 14

P[(BDT1-FTTN)-(BDT2-FTTK$_{(EH)}$)] Monomers distannyl-BDT1 (0.055 mmol), distannyl-BDT2 (0.111 mmol), dibromo-FTTK$_{(EH)}$ (36.66 mg, 0.083 mmol) and dibromo-FTTN (43.72 mg, 0.083 mmol) were combined in a Schlenk flask with Pd(PPh$_3$)$_4$ (19.1 mg, 0.017 mmol), toluene (6.6 mL) and DMF (1.65 mL). The reaction mixture was degassed via two freeze-pump-thaw cycles, using liquid nitrogen to freeze the solution. The solution was then heated to 120° C. and stirred for one day under Argon atmosphere. The reaction mixture was cooled to room temperature, poured into methanol (70 mL), and the polymer was collected by filtration. The polymer was purified by Soxhlet extraction, washing sequentially with acetone, hexanes, and chloroform. The polymer was recovered in the chloroform fraction (124 mg, 81% yield).

Example 15

P[(BDT1-FTTN)-(BDT2-FTTK$_{(B)}$)] Monomers distannyl-BDT1 (0.060 mmol), distannyl-BDT2 (0.119 mmol), dibromo-FTTK$_{(B)}$ (34.56 mg, 0.090 mmol) and dibromo-FTTN (47.2 mg, 0.090 mmol) were combined in a Schlenk flask with Pd(PPh$_3$)$_4$ (19.1 mg, 0.017 mmol), toluene (7.16 mL) and DMF (1.8 mL). The reaction mixture was degassed via two freeze-pump-thaw cycles, using liquid nitrogen to freeze the solution. The solution was then heated to 120° C. and stirred for one day under Argon atmosphere. The reaction mixture was cooled to room temperature, poured into methanol (70 mL), and the polymer was collected by filtration. The polymer was purified by Soxhlet extraction, washing sequentially with acetone, hexanes, and chloroform. The polymer was recovered in the chloroform fraction (107 mg, 67% yield).

Device Fabrication and Measurement

ZnO sol-gel was prepared by dissolving zinc acetate dihydrate (220 mg, 1 mmol) and ethanolamine (62 mg, 1 mmol) into 2-methoxyethanol (2 mL) and stirred for 1 h in air. ITO-coated glass substrates were washed with detergent (15 min), DI water (2×15 min), acetone (15 min), and isopropanol (15 min) in an ultrasonication bath. The substrates were placed in a vacuum oven at 80° C. for 2 h and placed in a UV-ozone cleaner for 15 minutes. After filtration with a 0.2 μm PVDF syringe filter, ZnO sol-gel was spin-coated onto the top of the ITO substrate at 5000 rpm for 30 s (acceleration 5000 rpm). The substrate was annealed at 170° C. in air for 15 min and taken into glove box for deposition of the active layer. At the same time, 10 mg of P(BDT-FTT) and 16 mg of $PC_{70}BM$ were mixed in ortho-xylene (1 mL) and stirred at 100° C. for 12 h. Diiodooctane (25 μL) was added to the solution and stirred for an additional 1 h, followed by filtration through a 0.45 μm PTFE syringe filter. Afterwards, the solution was coated on the substrate at 1,800, 2,000, and 2,200 rpm for 20 s. The substrate was solvent annealed inside of glass dishes for 1 h. After solvent annealing, the substrate was scratched at the edge to expose the ITO layer for the metal deposition. The substances were placed in the metal evaporator, and 14 nm of $MoO_3$ and 100 nm of Ag were deposited. The deposition speed for the $MoO_3$ was 0.5 Å/s. The deposition speed for Ag started at 0.5 Å/s until 5 nm was deposited. Afterward, the speed increased to 1-1.5 Å/s until 100 nm was deposited. The devices were encapsulated using UV-curable epoxy and a cover glass, and exposed to UV cure for 10 min.

The current density-voltage (J-V) curves were measured using a Keithley 2400 source meter. The photocurrent was measured under AM 1.5 G illumination at 100 mW/cm² under Newport Thermal Oriel 91192 1000W solar simulator (4"×4" beam size). The light intensity was calibrated by a mono-silicon detector (with KG-5 visible color filter) calibrated by National Renewable Energy Laboratory to minimize spectral mismatch.

Table 1 depicts some of the solar cell performance of the polymers in this study.

| Examples | % FTT propyl | $V_{oc}$ (V) | $J_{sc}$ (mA/cm²) | Fill Factor (%) | PCE (%) | $R_s$ (Ω·cm²) | $R_{sh}$ (Ω) |
|---|---|---|---|---|---|---|---|
| 1 | 100% | 0.740 | 17.3 | 62.4 | 7.99 | 4.6 | 5723 |
| 2 | 70% | 0.75 | 16.5 | 65.0 | 8.07 | 4.6 | 9412 |
| 3 | 50% | 0.77 | 16.5 | 70.1 | 8.90 | 3.4 | 9286 |
| 4 | 30% | 0.76 | 16.1 | 61.1 | 7.48 | 5.0 | 5547 |
| 5 | 10% | 0.80 | 14.5 | 65.5 | 7.60 | 5.2 | 7567 |
| 6 | 0% | 0.80 | 16.0 | 68.6 | 8.74 | 4.1 | 10504 |

Table 2 depicts the solar cell performance of polymers from Examples 7-9.

| Polymer | FTT(E):FTT(K1) ratio | $V_{oc}$ (V) | $J_{sc}$ (mA/cm²) | Fill Factor (%) | PCE (%) | $R_s$ (Ω·cm²) | $R_{sh}$ (Ω·cm²) |
|---|---|---|---|---|---|---|---|
| Example 7 | 0.25:0.75 | 0.81 | 15.89 | 59.95 | 7.72 | 7.25 | 620 |
| 8 | 0.5:0.5 | 0.77 | 17.29 | 64.79 | 8.26 | 5.19 | 779 |
| 9 | 0.75:0.25 | 0.79 | 16.83 | 67.84 | 9.04 | 4.34 | 815 |

Table 3 depicts the solar cell performance of polymers from Example 10.

| Polymer | FTT(E):FTT(K2) ratio | $V_{oc}$ (V) | $J_{sc}$ (mA/cm²) | Fill Factor (%) | PCE (%) | $R_s$ (Ω·cm²) | $R_{sh}$ (Ω·cm²) |
|---|---|---|---|---|---|---|---|
| Example 10 | 0.5:0.5 | 0.79 | 17.3 | 68 | 9.30 | 2.8 | 956 |

Table 4 depicts the solar cell performance of polymers from Example 11.

| Polymer | FTT(P):FTT(K1) ratio | $V_{oc}$ (V) | $J_{sc}$ (mA/cm²) | Fill Factor (%) | PCE (%) | $R_s$ (Ω·cm²) | $R_{sh}$ (Ω·cm²) |
|---|---|---|---|---|---|---|---|
| Example 11 | 0.5:0.5 | 0.81 | 15.77 | 63.49 | 8.11 | 4.97 | 713 |

Example 12

The polymer derivative of example 3 was further optimized in devices. A device structure was used which included a [6,6]-phenyl C61 butyric acid 2-hydroxyethyl ester (PCBE-OH) doped ZnO film as a interfacial layer. The resulting solar cell performance is depicted in the figure and Table 2 below. The $V_{oc}$ for this device slightly higher compared to the above fabrication method, and the $J_{sc}$ increases to 17.4 mA/cm².

TABLE 5

| Polymer | Device Structure | $V_{oc}$ (V) | $J_{sc}$ (mA/cm²) | Fill Factor (%) | PCE (%) | $R_s$ (Ω·cm²) | $R_{sh}$ (Ω) |
|---|---|---|---|---|---|---|---|
| Example 3 | ITO/ZnO/ZnO—PCBOH/active layer/$MoO_3$/Ag | 0.79 | 17.4 | 69.0 | 9.46 | 3.7 | 8311 |

TABLE 6

| Polymer | | $V_{oc}$ (V) | $J_{sc}$ (mA/cm²) | FF (%) | PCE (%) | $R_s$ (Ω·cm²) | $R_{sh}$ (Ω·cm²) |
|---|---|---|---|---|---|---|---|
| Example 12 | P[(BDT1-FTTN)-(BDT2-FTTE)] | 0.769 | 15.7 | 71.1 | 8.59 | 3.96 | 1160 |
| Example 13 | P[(BDT1-FTTN)-(BDT2-FTTP)] | 0.743 | 13.9 | 67.6 | 6.96 | 6.30 | 1323 |
| Example 14 | P[(BDT1-FTTN)-(BDT2-FTTK$_{(EH)}$)] | 0.809 | 11.5 | 59.9 | 5.55 | 8.50 | 759 |
| Example 15 | P[(BDT1-FTTN)-(BDT2-FTTK$_{(B)}$)] | 0.769 | 14.1 | 68.4 | 7.42 | 5.75 | 1690 |

$V_{oc}$—open circuit voltage;
$J_{sc}$—short circuit current;
FF—fill factor;
PCE—power conversion efficiency;
$R_s$—series resistance;
$R_{sh}$—shunt resistance In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A process comprising:
polymerizing

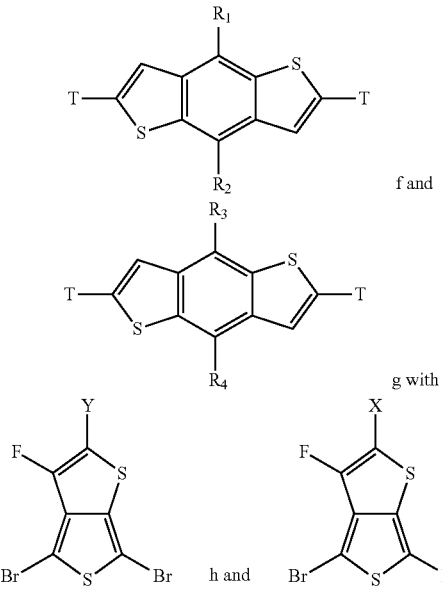 f and g with

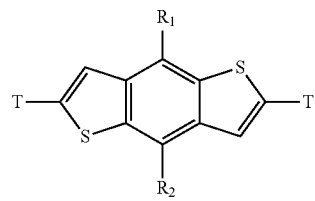 h and i wherein the stoichiometric ratio of (f+g)≈(h+i) and f, g, h and i are not equal to 0 wherein R1, R2, R3 and R4 are independently selected from the group consisting of alkyl group, alkoxy group, aryl groups and combinations thereof and where the combination of R1, R2, R3 and R4 are not all identical; and X and Y are different from each other and independently selected from the group consisting of: alkyl group, alkoxy group, aryl groups,

where y=1-3,

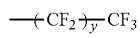

where y=0-12,

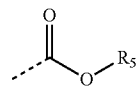

where R5 is selected from the group consisting of H, alkyl group, alkoxy group, aryl groups,

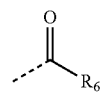

where R6 is selected from the group consisting of H, alkyl group, alkoxy group, aryl groups,

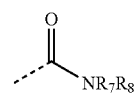

where R7 and R8 are independently selected from the group consisting of H, alkyl group, alkoxy group, aryl groups, —NR9R10 where R9 and R10 are independently selected from the group consisting of H, alkyl group, alkoxy group, aryl groups wherein T and Z are any functional groups used in the polymerization reaction; and wherein is a di-Me3Sn substituted benzo[1,2-b:4,5-b']dithiophene.

2. The process of claim 1, wherein the process produces a conjugated polymer.

3. The process of claim 1, wherein the polymerizing of f, g, h and i is regio-regular.

4. The process of claim 1, wherein the polymerizing of f, g, h and i is regio-random.

5. The process of claim 1, wherein the process produces a photovoltaic material.

6. The process of claim 5, wherein the photovoltaic devices is used as a polymer solar cell device or photodetector device.

7. The process of claim 1, wherein the process produces an active layer material for one or more electronic devices.

8. The process of claim 7, wherein the one or more electronic devices are field effect transistors, light emitting devices, and sensors, electrochromic devices and capacitors.

9. The process of claim 1, wherein the ratio of

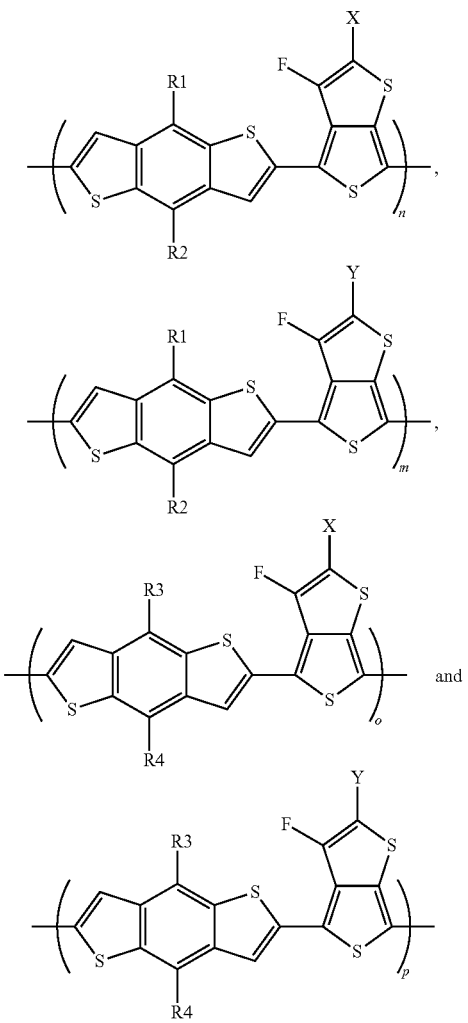

in the polymer is around 25:25:25:25.

10. The process of claim 1, wherein

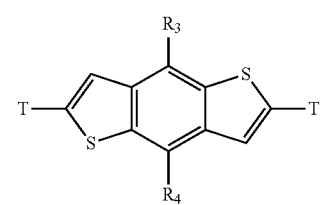

is a di-Me3Sn substituted benzo[1,2-b:4,5-b']dithiophene.

11. The process of claim 1, wherein the polymerizing reaction comprises: stille coupling, suzuki coupling, a nickel catalyzed reaction or direct arylation.

12. The process of claim 1, wherein functional group T of components f and g reacts exclusively with functional group Z of components h and i.

13. The process of claim 1, wherein T is selected from the group consisting of Me$_3$Sn, C$_6$H$_{12}$, O$_2$B, Br and combinations thereof.

14. A process comprising:
polymerizing

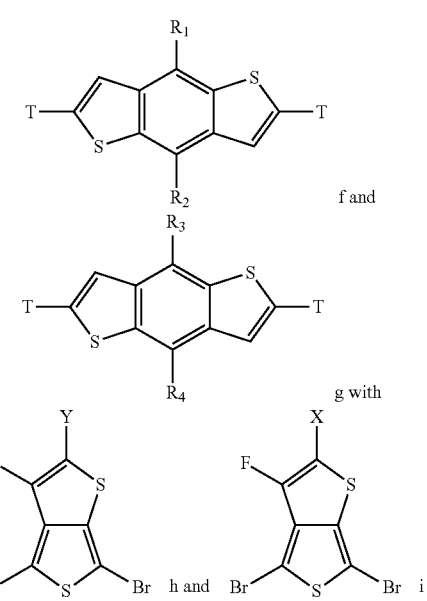

wherein the stoichiometric ratio of (f+g)≈(h+i) and f, g, h and i are not equal to 0; wherein substituent T of component f and g reacts exclusively with substituents Z of components h and I;

wherein R1, R2, R3 and R4 are independently selected from the group consisting of alkyl group, alkoxy group, aryl groups and combinations thereof and where the combination of R1, R2, R3 and R4 are not all identical; and x and y are different from each other and independently selected from the group consisting of: alkyl group, alkoxy group, aryl groups,

where y=1-3,

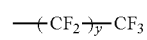

where y=0-12,

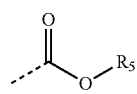

where R5 is selected from the group consisting of H, alkyl group, alkoxy group, aryl groups,

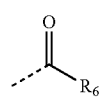

where R6 is selected from the group consisting of H, alkyl group, alkoxy group, aryl groups,

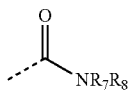

where R7 and R8 are independently selected from the group consisting of H, alkyl group, alkoxy group, aryl groups, —NR9R10 where R9 and R10 are independently selected from the group consisting of H, alkyl group, alkoxy group, aryl groups and the polymerization of f, g, h and i are selected from stille coupling, suzuki coupling, a nickel catalyzed reaction or direct arylation wherein T and Z are any functional groups used in the polymerization reaction;

and wherein

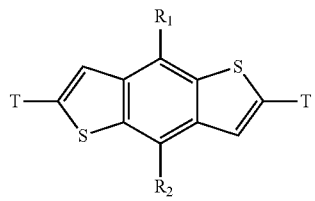

is a di-Me3Sn substituted benzo[1,2-b:4,5-b']dithiophene.

15. A process for polymerizing

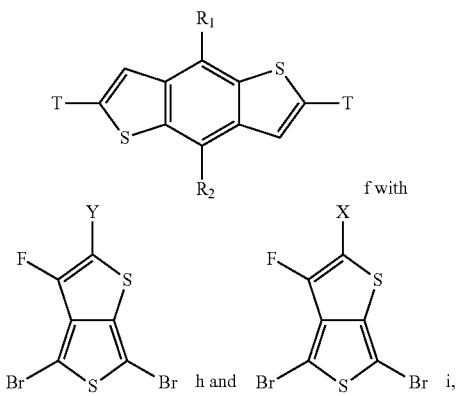

f with

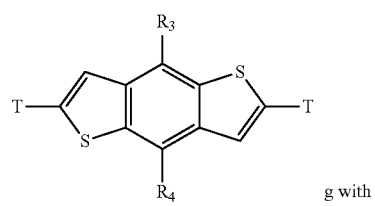

wherein the improvement comprises
simultaneously polymerizing

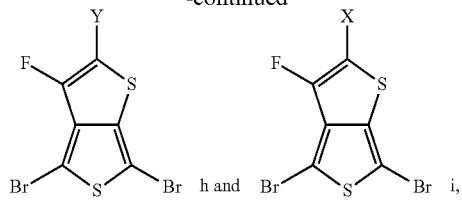

g with

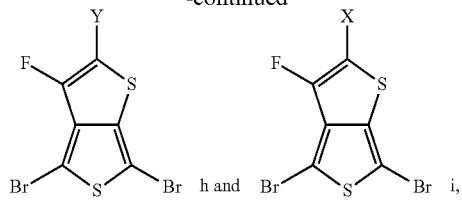

-continued

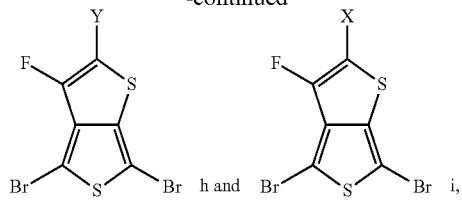

h and

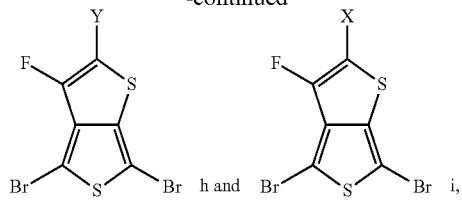

i, wherein the stoichiometric ratio of (f+g)≈(h+i) and f, g, h and i are not equal to 0 wherein R1, R2, R3 and R4 are independently selected from the group consisting of alkyl group, alkoxy group, aryl groups and combinations thereof and where the combination of R1, R2, R3 and R4 are not all identical; and x and y are different from each other and independently selected from the group consisting of: alkyl group, alkoxy group, aryl groups,

where y=1-3,

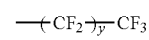

where y=0-12,

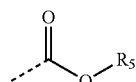

where R5 is selected from the group consisting of H, alkyl group, alkoxy group, aryl groups,

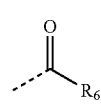

where R6 is selected from the group consisting of H, alkyl group, alkoxy group, aryl groups,

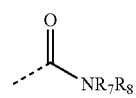

where R7 and R8 are independently selected from the group consisting of H, alkyl group, alkoxy group, aryl groups, —NR9R10 where R9 and R10 are independently selected from the group consisting of H, alkyl group, alkoxy group, aryl groups wherein T and Z are any functional group used in the polymerization reaction; and wherein
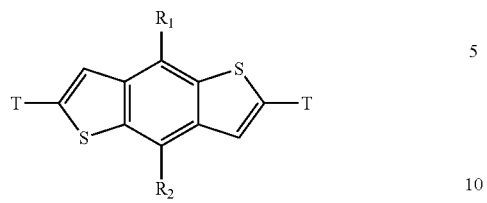
is a di-Me3Sn substituted benzo[1,2-b:4,5-b']dithiophene.
* * * * *